(12) United States Patent
Butler et al.

(10) Patent No.: US 7,453,186 B1
(45) Date of Patent: Nov. 18, 2008

(54) CANTILEVER DRIVEN TRANSDUCTION APPARATUS

(75) Inventors: Alexander L. Butler, Weymouth, MA (US); John L. Butler, Cohasset, MA (US)

(73) Assignee: Image Acoustics, Inc, Cohasset, MA (US)

( * ) Notice: Subject to any disclaimer, the term of this patent is extended or adjusted under 35 U.S.C. 154(b) by 0 days.

(21) Appl. No.: 11/974,976

(22) Filed: Oct. 17, 2007

(51) Int. Cl.
*H01L 41/08* (2006.01)
*H01L 41/09* (2006.01)

(52) U.S. Cl. .................................................. 310/330

(58) Field of Classification Search ................ 310/330, 310/334, 312, 328, 307, 306, 311; 367/157, 367/162–163, 167
See application file for complete search history.

(56) References Cited

U.S. PATENT DOCUMENTS

| | | | |
|---|---|---|---|
| 3,378,814 A | 4/1968 | Butler | |
| 3,845,333 A | 10/1974 | Holloway | |
| 3,924,259 A | 12/1975 | Butler et al. | |
| 4,326,275 A | 4/1982 | Butler | |
| 4,438,509 A | 3/1984 | Butler et al. | |
| 4,443,731 A | 4/1984 | Butler et al. | |
| 4,604,542 A | 8/1986 | Thompson | |
| 4,633,119 A | 12/1986 | Thompson | |
| 4,642,802 A | 2/1987 | Pozzo et al. | |
| 4,742,499 A * | 5/1988 | Butler | 310/334 |
| 4,752,918 A | 6/1988 | Boucher et al. | |
| 4,754,441 A | 6/1988 | Butler | |
| 4,811,307 A | 3/1989 | Pohlenz et al. | |
| 4,845,688 A | 7/1989 | Butler | |
| 4,864,548 A | 9/1989 | Butler | |
| 5,047,683 A | 9/1991 | Butler et al. | |
| 5,081,391 A | 1/1992 | Owen | |
| 5,184,332 A | 2/1993 | Butler | |
| 5,742,561 A * | 4/1998 | Johnson | 310/334 |
| 5,957,851 A | 9/1999 | Hossack | |
| 6,465,936 B1 * | 10/2002 | Knowles et al. | 310/328 |
| 6,643,222 B2 | 11/2003 | Osborn et al. | |
| 6,654,316 B1 * | 11/2003 | Butler et al. | 310/334 |
| 6,734,604 B2 | 5/2004 | Butler et al. | |
| 6,950,373 B2 | 9/2005 | Butler et al. | |
| 2002/0043897 A1 | 4/2002 | Dunn et al. | |

* cited by examiner

*Primary Examiner*—Thomas M. Dougherty
*Assistant Examiner*—Karen B Addison
(74) *Attorney, Agent, or Firm*—David M. Driscoll, Esq.

(57) ABSTRACT

An electromechanical transducer which provides orthogonal translated motion to a piston through an attached lever arm connected to and driven by at least two electromechanical cantilever members, mounted on a separate inertial tail mass, and which under full array loading conditions provide a reduced resonance frequency that yields velocity control in the vicinity of that resonance.

24 Claims, 4 Drawing Sheets

CANTILEVER DRIVEN TRANSDUCTION APPARATUS

BACKGROUND OF THE INVENTION

1. Field of the Invention

The present invention relates in general to transducers and more particularly to a transducer with orthogonal lever arm translated motion driven by electromechanical cantilever benders mounted on an inertial tail mass, providing a wide-band low frequency response from a low profile apparatus.

2. Background and Discussion

Low frequency underwater sound transducers generally require large housings to provide room for a large compliant active spring needed for both low frequency resonance and high displacement. Lever arm orthogonal action may be used to reduce the height of the enclosure and provide amplified motion. A number of piezoelectric systems have been devised to provide the drive for the lever systems, but these drive systems are generally stiff and usually take the form of extensional drivers such as bars, discs or rings. U.S. Pat. No. 6,654,316 B1 (Nov. 24, 2003) to Butler et al. describes an alternative, more compliant means which uses a piezoelectric bending beam driver to excite the lever arm from the bending displacement at the two ends of the piezoelectric bending beam wherein the beam also acts as an inertial tail mass. U.S. Pat. No. 6,720,708 B2 (Apr. 13, 2004) to Athanas describes an audio loudspeaker in which a transparent curved diaphragm is fixed at one end (or at the center) and driven at the other end (or at the ends) by one or more actuators. However, none of the existing transducers provide an improved operation, particularly a low-frequency, wide-band, low-profile acoustic transducer with lowered resonance under full array loading conditions Accordingly, it is an object of the present invention to improve the type of motion of the radiating surface of a transducer and to also create a low-frequency, wide-band, low-profile acoustic transducer with lowered resonance under full array loading conditions.

An additional object of the present invention is to provide an improved transducer in which a piston radiator may be added at the location of maximum motion on the lever arm allowing full array loading.

A further object of the present invention is to provide an improved transducer wherein there is obtained a fixed velocity condition in the vicinity of resonance.

SUMMARY OF THE INVENTION

To accomplish the foregoing and other objects, features and advantages of this invention there is provided an improved electromechanical cantilever bender transduction apparatus that employs means for utilizing lever arm motion from the electromechanical drivers in a way that creates improved motion of the radiating surface. This, coupled with a low impedance piston, yields a lowered resonance frequency under full array loading along with a fixed velocity array condition in the vicinity of this lowered resonance.

In accordance with the invention there is provided an electromechanical transduction apparatus that is comprised of two piezoelectric cantilever bars or plates, rigidly mounted on a tail mass and connected on the opposite end to a central lever arm member separating the two with a piston attached at the center of the lever arm. The transducer may be used within a watertight housing and compliantly mounted from the head or tail. The two piezoelectric sections of each cantilever are wired for opposite extension creating a bending mode, which through the rigid tail mounting causes transverse motion of the opposite ends connected to the lever arm, resulting in significant motion of the piston and a large volumetric motion into the medium. With an alternating electrical drive on the cantilevers and as a result of the lever arm action, the piston moves in a direction perpendicular to the cantilever motion. The piezoelectric cantilevers may be of 33 or 31 mode design and wired to operate in unison so that both bend outward or inward, at the same time, causing corresponding outward or inward forces on the central lever arm with corresponding outward or inward piston motion.

In one preferred embodiment the piston is square, driven by a lever arm with dual piezoelectric PZT type cantilevers driving the lever arm from a common tail mass and suspended in a watertight housing from a compliant isolation member between the piston and the housing. The mass ratio between the piston head mass and inertial tail mass as well as the head mass impedance and radiation resistance ratio is preferably chose to yield a lowered resonance frequency with fixed-velocity drive conditions under full array loading.

In accordance with the invention there is also provided an electromechanical apparatus that comprises:
- at least two piezoelectric bender drivers;
- at least one concave lever arm;
- at least one piston radiator attached to the lever arm;
- at least one inertial tail mass;
- a housing with a compliant support for the transducer;

As a reciprocal device the transducer may also be used as a receiver. The transducer is presented as a device that may be used in a fluid medium, such as water, but it may also be used in a gas, such as air. Although the embodiments illustrate means for acoustic radiation into a medium from pistons, alternatively, a mechanical load could replace the medium and in this case the transducer would be an actuator.

BRIEF DESCRIPTION OF THE DRAWINGS

Numerous other objectives, features and advantages of the invention should now become apparent upon a reading of the following detailed description taken in conjunction with the accompanying drawings, in which.

DETAIL DESCRIPTION

In accordance with the present invention, there is now described herein a number of different embodiments for practicing the present invention. Reference is made in particular to FIGS. 1-7 for illustration of the principles of the present invention.

In the present invention there is described a compliant cantilever drive means which uses a lever arm that is driven by at least two electromechanical cantilevers at opposite sides of the lever arm and mounted on an inertial tail mass. This transducer, coupled to a piston, yields a low frequency wideband response from a low profile housing. Under closely packed array loaded conditions, this transducer yields a resonance lower than normally attained under array conditions and a desirable fixed velocity output, reducing array interaction problems at this resonance.

There is described herein a low profile transducer for obtaining a reduced low frequency resonance and wide band performance by a combined means of cantilever active drive elements and a lever arm translation device providing large piston displacement. The transducer of the present invention is particularly adapted for underwater applications, but the principles described herein may also apply to other acoustic applications. For underwater applications the transducer yields a resonance lower than its in-air resonance even under fully array loaded resistive conditions for the case of a low piston mass reactance compared to the resistive load.

Figure 1:
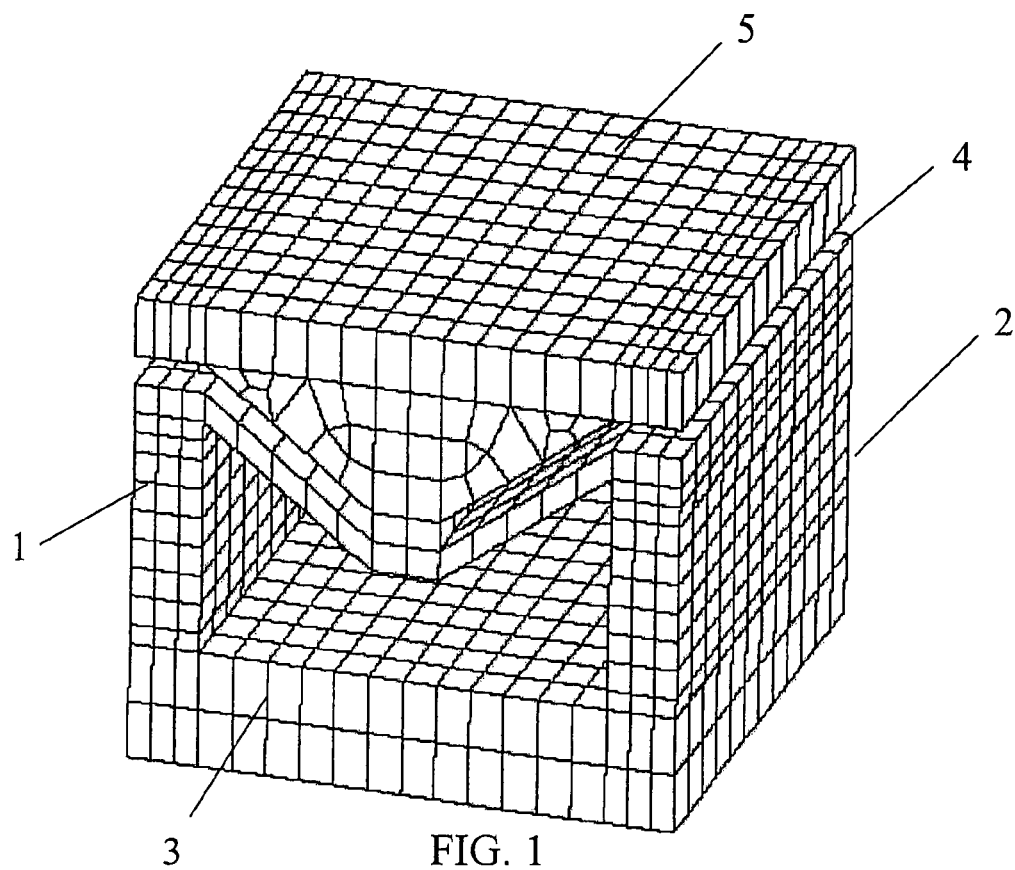
FIG. 1 is a schematic perspective view of the invention showing the piston radiator, lever arm, tail mass and dual cantilever piezoelectric drivers.
Figure 2:
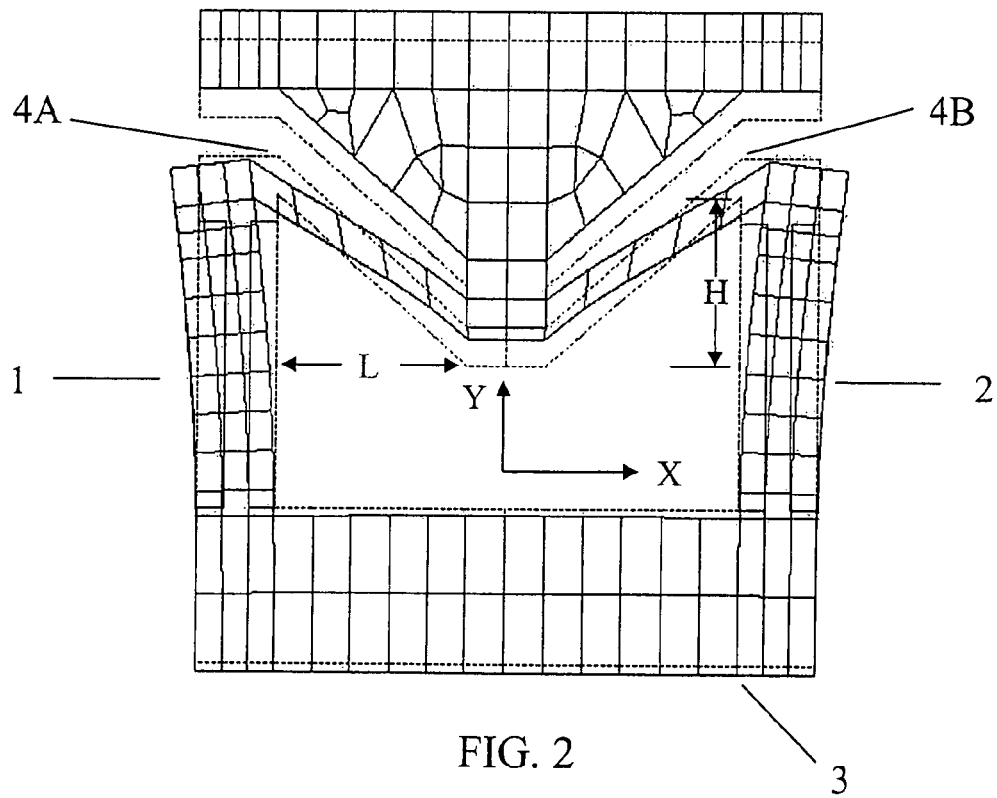
FIG. 2 is a sketch showing the modal motion of the transducer of FIG. 1 under electrical drive with the piezoelectric cantilever benders moving oppositely in the X direction causing the lever arm and piston to move upward in the Y direction.

A perspective view of a preferred embodiment is shown in FIG. 1 with labeled parts of the transducer and with an additional piston mass. A finite element model showing the dynamic motion during part of a cycle is illustrated in FIG. 2 showing the translated motion of the piston. In FIG. 1, elements 1 and 2 are piezoelectric cantilever bending plates operating together in a planar bending mode. The two plates are mounted onto an alumina (or other stiff material such as steel or titanium) inertial tail section 3 and connected to the (typically high strength steel) lever arm 4 which, in turn, supports the piston 5 (typically aluminum or magnesium) at the location of maximum magnified motion. The piston 5 is shown in FIG. 2 as being connected at the center of the lever arm 4. No connecting member is provided directly between the tail mass and the piston, as the piston is driven from the lever arm. The piezoelectric benders 1 and 2 are arranged as cantilever members cantilevering from the tail mass 3 and supporting respective opposed ends of the lever arm 4.

The lever arm 4 (considered as including left and right arm sections 4A and 4B) converts the lateral X direction motion of the cantilevers 1 and 2, and yields a Y directed axial motion of the piston. The lever arms can also provide magnified piston motion given approximately by the lever arm magnification ratio L/H, where L is the distance from the cantilever to the edge of the lever arm section and H is the height of the lever arm as shown in FIG. 2. The full magnification affect is not translated to the piston because of opposite motion of the tail mass 3; and there is no magnification for L=H, as in the particular case illustrated in FIG. 2. This case may be most desirable under full array heavy loading conditions where the radiation damping is great. The piston is typically rectangular or square shaped, designed for minimal flexure and for full array loading within the band of operation.

Figure 3A:
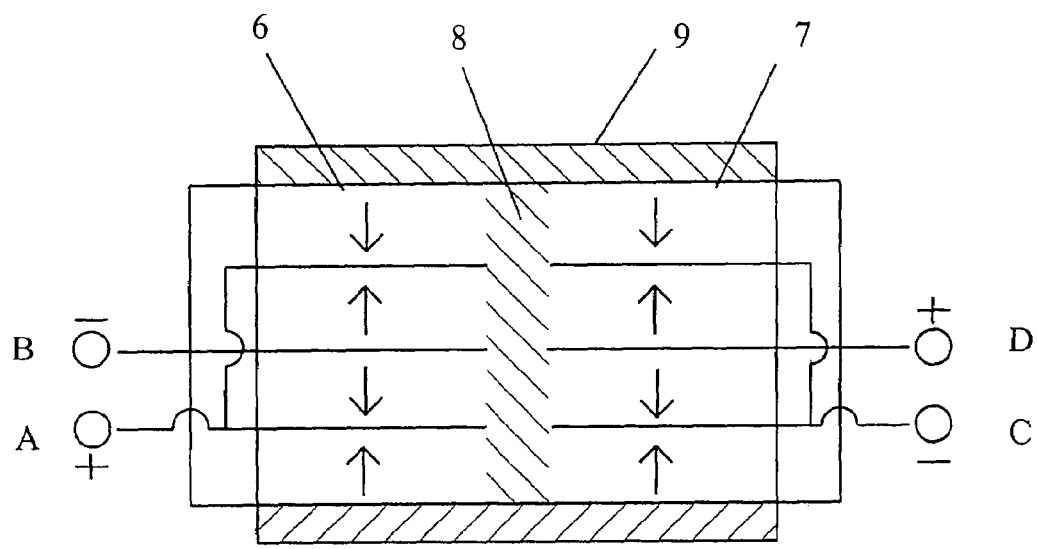
FIG. 3A is a sketch showing the electrical wiring of a piezoelectric cantilever operating in a 33 mode.
Figure 3B:
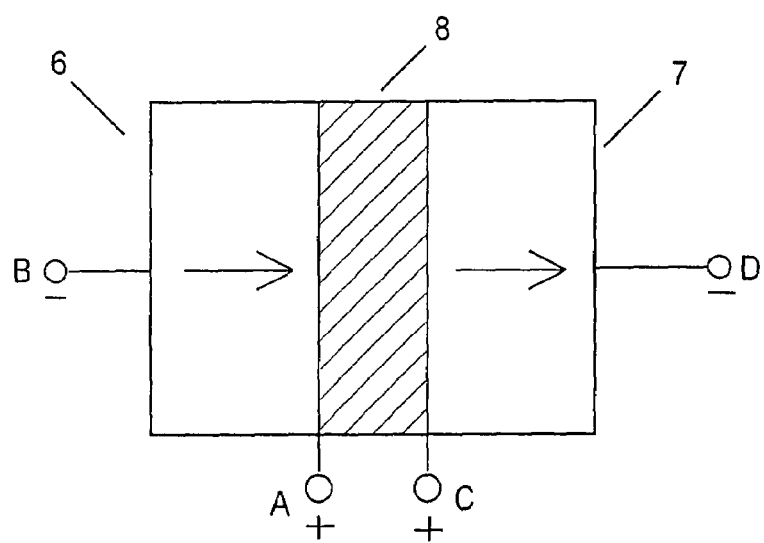
FIG. 3B is a sketch showing the electrical wiring of a piezoelectric cantilever operating in a 31 mode.
Figure 3C:
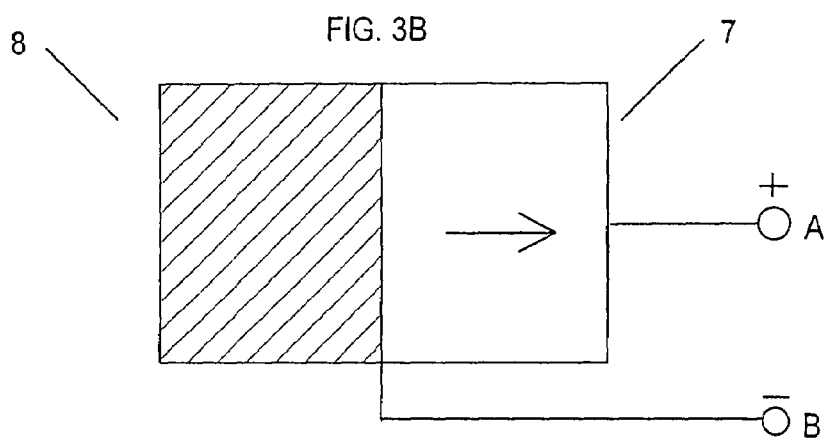
FIG. 3C is a sketch showing the electrical wiring of a piezoelectric cantilever operating in a 31 mode with one side of inactive material.

FIGS. 3A, 3B and 3C show three typical methods for operating the piezoelectric cantilever benders in the higher coupling 33 mode of operation and in the, lower coupling, but simpler 31 mode of operation. FIG. 3A illustrates a non-electrode section, 8, between piezoelectric polarized sides 6 and 7 with the direction of polarization given by the arrows shown in FIG. 3A. Bending is obtained by operating sections or sides 6 and 7 out-of-phase with each other by applying voltages at terminals A and B of opposite phase with the voltage at terminals D and C as shown by the + polarity on A and the − polarity on C. This may also be accomplished without a phase reversal at the terminals by reversing the direction of polarization in section 7. The inactive space, 8, between the two sides may be formed by removing the electrodes in that section or by means of an additional inactive piece of material. Section 9 is one of two typical electrical insulators on opposite ends of the piezoelectric cantilevers.

FIG. 3B shows the simpler case of the 31 mode of operation. In the polarized arrangement shown, the terminals A and B would be wired in phase with the corresponding C and D terminals. Parallel or series wire arrangements are possible in FIGS. 3A and 3B. The diagram of FIG. 3C illustrates a 31 mode bending case where one plate 8, is an inactive material and the other plate 7, is an active piezoelectric material. FIG. 3C also shows the applied voltages at terminals A and B.

Figure 4A:
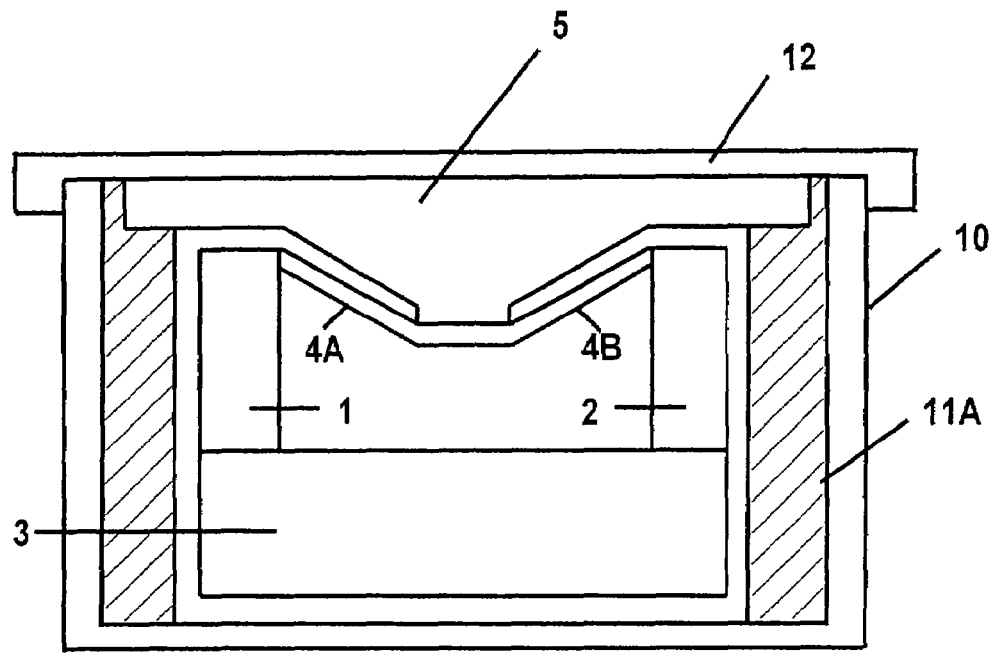
FIG. 4A is a sketch of the transducer in a watertight housing showing the compliant suspension mounting system attached to the transducer piston along with a rubber or polyurethane water-tight boot.
Figure 4B:
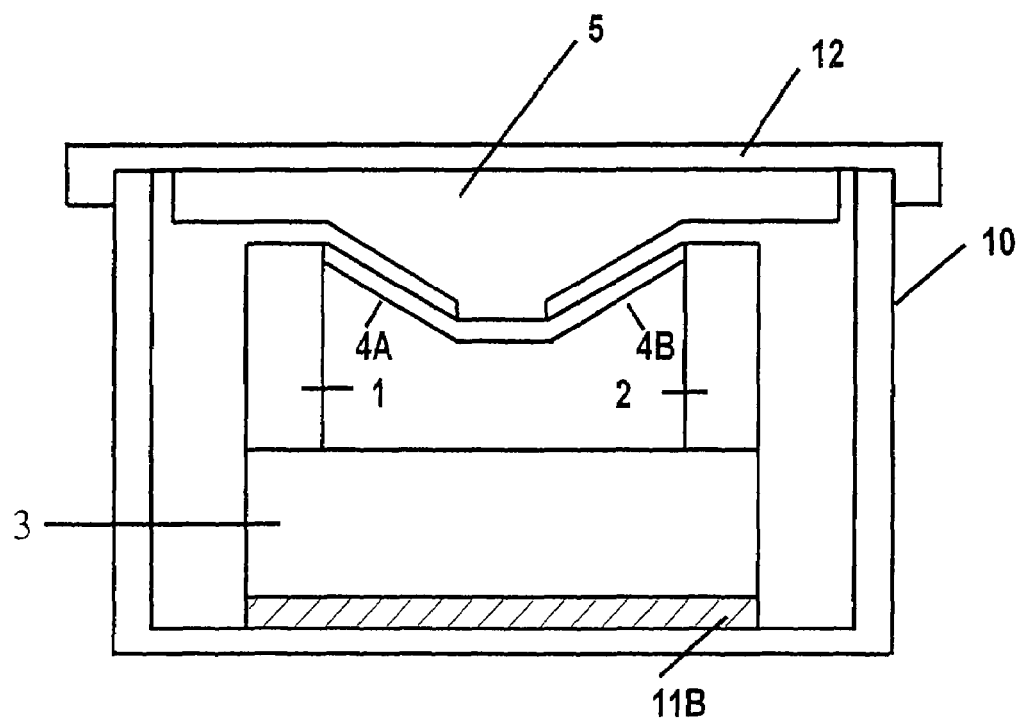
FIG. 4B is a sketch of the transducer in a watertight housing showing the compliant suspension mounting system attached to the transducer tail mass along with a rubber or polyurethane water-tight boot.

A typical underwater housing for the transducer shown in FIGS. 1 and 2 is illustrated in FIG. 4A showing the compliant piston suspension mounting system 11A, attached to the transducer piston 5, a housing 10 and a water tight rubber or polyurethane boot 12. The transducer is isolation mounted from the piston head 5 for deep water operation, but could be mounted from the tail for shallow water operation as shown in FIG. 4B with mounting system 11B. The vibration isolation material 11A or 11B is typically cork impregnated rubber, paper, nylon or syntactic foam depending on the pressure requirements.

Figure 5:
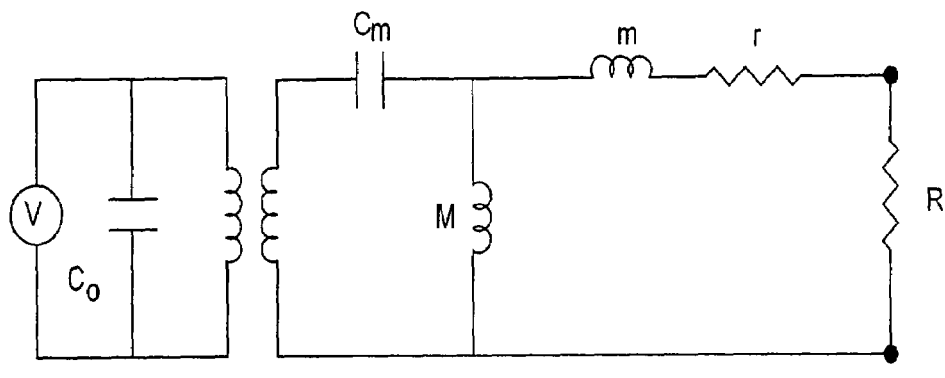
FIG. 5 is a simplified equivalent circuit of the transducer.

A simplified piezoelectric equivalent circuit of the transducer of FIGS. 1 and 2, with H approximately equal to L, is shown in FIG. 5 illustrating the input drive voltage V, the clamped capacity $C_0$, the electromechanical turns ratio, N, the mechanical compliance, $C_m$, of the cantilever benders, the tail mass M, the piston head mass, m, the mechanical loss resistance, r, and the radiation resistance R under fully array loaded conditions with a mechanical efficiency $\rho=R/(R+r)$.

From this circuit a normalized squared acceleration response (which is proportional to the acoustic intensity response in the fluid) may be written as:

$$|a/a_0|^2 = [x^4 B^2]/[(1+B-x^2)^2 + (1-x^2)^2/Q^2 x^2]$$

where B=M/m, $x=f/f_0$, $Q=2\pi f_0 m/(R+r)$, $f_0=(1/2\pi)(1/MC_m)^{1/2}$, $a_0=(2\pi f_0)^2 C_m NV$.

Figure 6:
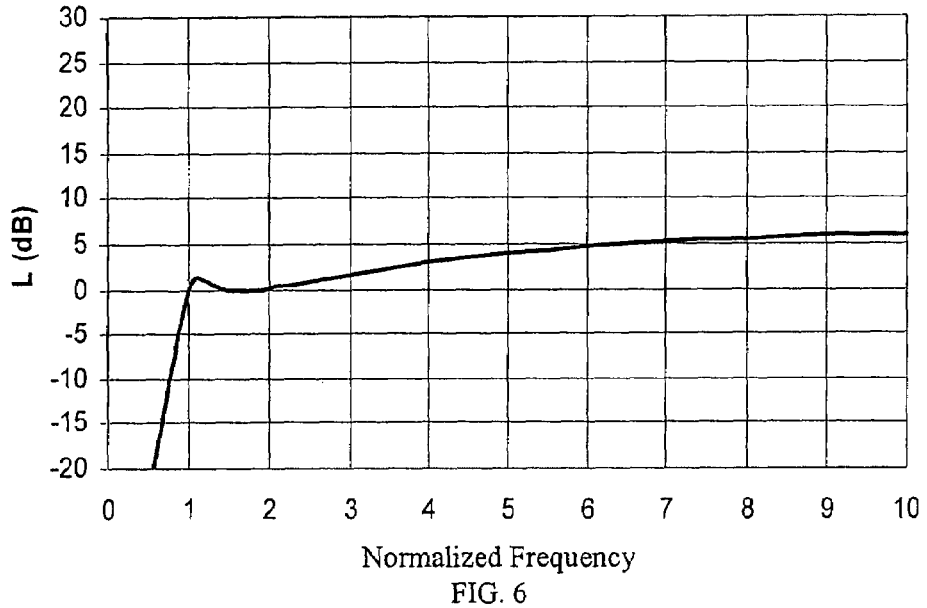
FIG. 6 is a normalized acceleration response calculated from the equivalent circuit.
Figure 7:
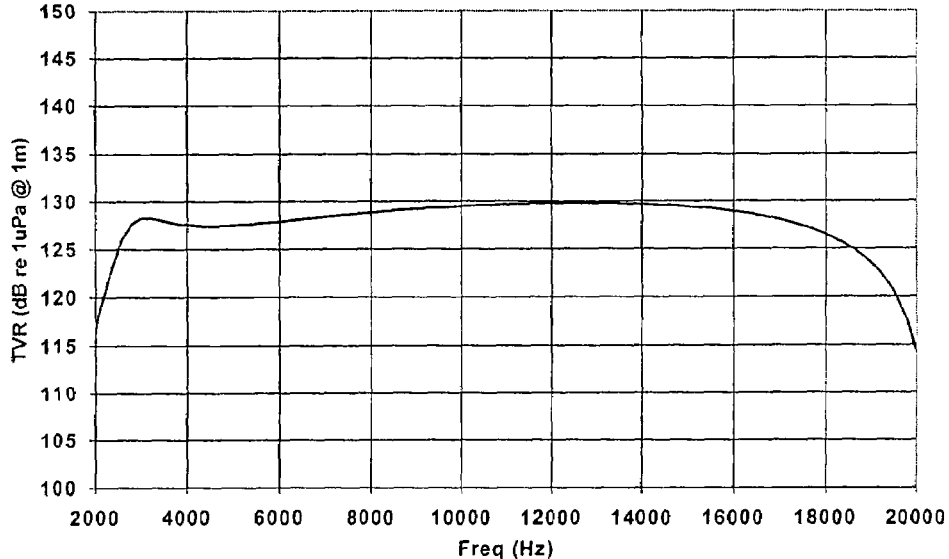
FIG. 7 is the finite element calculated transmitting voltage response (TVR) under full array loading conditions for a design with four elements each with overall dimension approximately 2"×2"×1.5".

The normalized acceleration level response, $L=10 \log(|a/a_0|^2)$, as a function of the normalized frequency $x=f/f_0$ for the case of B=2.3 and Q=0.165, is shown in FIG. 6 revealing a resonance frequency nearly equal to $f_0$, which is considerably lower than the typical two-mass resonance of $f_r=(1/2\pi)(1/mC_m)^{1/2}(1+m/M)^{1/2}$. It can be seen that $f_0=f_r/(1+B)^{1/2}$ and for the above case of B=2.3 we get $f_0=0.55 f_r$, or nearly half the typical transducer resonance frequency, $f_r$, under fully array loading (a condition where the radiation mass is typically negligible). This response curve is very similar to the finite element calculated transmitting response curve of FIG. 7, except for the roll off at the high end which is due to tail mass flexure, not included in the simple model of FIG. 5. An efficiency of 75% was assumed in both cases.

This special low-frequency wideband response is a result of the low resonance frequency of the invention allowing a situation where the piston reactance, $(2\pi f_0)m$, is small, compared to the resistive load, (R+r), leading to Q<<1 resulting in a parallel resonance between M and $C_m$, as can be seen to exist in FIG. 5 under constant voltage drive condition. This parallel resonance at $f_0$ is not only lower in frequency than the typical value $f_r$, but it is of much higher mechanical impedance than the typically low impedance of the prior art common series resonance at $f_r$. The high impedance at $f_0$ has an advantage under array interaction, allowing the transducer to operate under a controlled velocity condition reducing the undesirable result of velocity variations over the array of transducers as a result of the array pressure distribution.

Having now described a limited number of embodiments of the present invention and an underwater transducer implementation, it should now become apparent to those skilled in the art, that numerous other embodiments and modifications thereof are contemplated as falling within the scope of the present invention as defined in the appended claims. Examples of modification would be the use of other transduction devices or materials such as single crystal material, PMN-28% PT, magnetostriction or electrostriction and a different bender mode wring arrangement. The exterior medium could be a gas, such as air, or a mechanical load and in this latter case the transducer would be used as an actuator. As a result of reciprocity, the transduction device can be used as a receiver of sound as well as a transmitter of sound.

What is claimed is:

1. An electromechanical transduction apparatus that is comprised of at least two voltage driven piezoelectric cantilever benders operating in unison, a tail mass, at least one lever arm, said cantilever benders being attached on one end to respective ends of the tail mass and attached at the other end to respective ends of the lever arm, wherein the motion imparted to the lever arm from the cantilever benders provides an orthogonal translated motion relative to the cantilever motion.

2. An electromechanical transduction apparatus as set forth in claim 1 wherein the length to height ratio, L/H, of the lever arm section yields a magnified motion of the center point of the lever arm relative to the motion of the cantilever arms.

3. An electromechanical transduction apparatus as set forth in claim 1 wherein the length to height ratio, L/H, of the lever arm section is approximately unity yielding no magnified motion of the center point of the lever arm relative to the motion of the cantilever arms.

4. An electromechanical transduction apparatus as set forth in claim 1 wherein the piezoelectric cantilever benders operate in unison with equal outward and inward motions to provide orthogonal magnified motion.

5. An electromechanical transduction apparatus as set forth in claim 1 wherein the tail mass is a stiff inertial tail mass.

6. An electromechanical transduction apparatus as set forth in claim 1 wherein the piezoelectric cantilever benders are comprised of an electromechanical active material that is at least one of piezoelectric, electrostrictive, single crystal, magnetostrictive and other electromechanical drive material or transduction systems.

7. An electromechanical transduction apparatus as set forth in claim 4 wherein the piezoelectric cantilever benders are wired to operated in the planar, 31 or 33 bender modes.

8. An electromechanical transduction apparatus as set forth in claim 1 wherein the piezoelectric cantilever benders are comprised of at least one of plates and bars.

9. An electromechanical transduction apparatus as set forth in claim 1 including a piston attached to the lever arm at the location of maximum motion.

10. An electromechanical transduction apparatus as set forth in claim 1 including a mechanical load attached to the lever arm at the location of maximum motion.

11. An electromechanical transduction apparatus as set forth in claim 9 which acts as a receiver and produces an output voltage as a result of an acoustic pressure on the piston from an incoming acoustical wave.

12. An electromechanical transduction apparatus as set forth in claim 1 which produces a resonance in the vicinity of $f_0=(1/2\pi)(1/2MC_m)^{1/2}$ where $C_m$ is the equivalent mechanical compliance of the transducer and M is the inertial tail mass.

13. An electromechanical transduction apparatus as set forth in claim 12 which provides velocity control, in the vicinity of $f_0$, under array loading conditions.

14. An electromechanical apparatus that comprises:
   at least two piezoelectric bender drivers each having one and another ends;
   at least one concave lever arm having one and another ends;
   at least one piston radiator attached to the lever arm;
   at least one inertial tail mass having one and another ends;
   means for mounting the piezoelectric bender drivers with the one end thereof supported at respective one and another ends of the inertial tail mass, and with the another end thereof supported at respective one and another ends of the lever arm;
   and a housing with a compliant support.

15. An electromechanical apparatus as set forth in claim 14 wherein the piezoelectric bender drivers comprise cantilever bender drivers that operate in unison with equal outward and inward motions.

16. An electromechanical apparatus as set forth in claim 15 wherein the piezoelectric cantilever bender drivers are comprised of an electromechanical active material that is at least one of piezoelectric, electrostrictive, single crystal, magnetostrictive and other electromechanical drive material or transduction systems.

17. An electromechanical apparatus as set forth in claim 16 wherein the piezoelectric cantilever bender drivers are wired to operated in the planar, 31 or 33 bender modes.

18. An electromechanical apparatus as set forth in claim 15 wherein the piezoelectric cantilever bender drivers are comprised of at least one of plates and bars.

19. An electromechanical apparatus as set forth in claim 14 including a piston attached to the lever arm at the location of maximum motion.

20. An electromechanical apparatus as set forth in claim 14 including a mechanical load attached to the lever arm at the location of maximum motion.

21. An electromechanical apparatus as set forth in claim 19 which acts as a receiver and produces an output voltage as a result of an acoustic pressure on the piston from an incoming acoustical wave.

22. An electromechanical apparatus as set forth in claim 14 which produces a resonance in the vicinity of $f^0=(1/2\pi)(1/MC_m)^{1/2}$ where $C_m$ is the equivalent mechanical compliance of the transducer and M is the inertial tail mass.

23. An electromechanical apparatus as set forth in claim 22 which provides velocity control, in the vicinity of $f_0$, under array loading conditions.

24. A method of operating an electromechanical transduction apparatus that is comprised of at least two voltage driven piezoelectric cantilever benders, an inertial tail mass and a lever arm, including operating the benders in unison with equal outward and inward motions, attaching the respective benders rigidly on one end to separate locations of the inertial tail mass, attaching the respective benders at the other end to the lever arm and translating, through the benders, the benders motion into an orthogonal translated motion relative to the cantilever motion.

* * * * *